(12) United States Patent
Nishimoto et al.

(10) Patent No.: US 6,582,761 B1
(45) Date of Patent: Jun. 24, 2003

(54) METHOD OF PRODUCTION OF COMPOSITED PARTICLE, COMPOSITED PARTICLE PRODUCED BY THIS METHOD AND AQUEOUS DISPERSION FOR CHEMICAL MECHANICAL POLISHING CONTAINING THIS COMPOSITED PARTICLE, AND METHOD OF PRODUCTION OF AQUEOUS DISPERSION FOR CHEMICAL MECHANICAL POLISHING

(75) Inventors: Kazuo Nishimoto, Tokyo (JP); Masayuki Hattori, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 26 days.

(21) Appl. No.: 09/716,384

(22) Filed: Nov. 21, 2000

(30) Foreign Application Priority Data

Nov. 22, 1999 (JP) ............................ 11-331504
Nov. 22, 1999 (JP) ............................ 11-331505

(51) Int. Cl.[7] .................................... B05D 1/36
(52) U.S. Cl. .................. 427/203; 427/180; 427/222; 428/403; 428/405
(58) Field of Search .................. 427/212, 213.3, 427/215, 216, 219, 220, 221, 180, 203, 457, 472, 474, 475; 428/402, 403, 405, 407; 510/508

(56) References Cited

U.S. PATENT DOCUMENTS 4,151,154 A * 4/1979 Berger ........................ 428/405
4,777,153 A 10/1988 Sonuparlak et al. .......... 501/82
5,714,259 A * 2/1998 Holmes et al. .............. 428/402
6,048,254 A * 4/2000 Duescher .................... 451/28

FOREIGN PATENT DOCUMENTS

| EP | 0 823 450 | 2/1998 |
| JP | 6-40951 | 6/1994 |
| JP | 7-86216 | 3/1995 |
| JP | 11-114808 | 4/1999 |

OTHER PUBLICATIONS

Patent Abstracts of Japan, JP 62–213839, Sep. 19, 1987.

* cited by examiner

Primary Examiner—Michael Barr
Assistant Examiner—Rebecca A. Blanton
(74) Attorney, Agent, or Firm—Oblon, Spivak, McClelland, Maier & Neustadt, P.C.

(57) ABSTRACT

The present invention relates to a method for producing a composited particle in which an inorganic particle is not released, a composited particle produced by this method, and an aqueous dispersion for CMP containing this composited particle. The method for producing a composited particle of the present invention comprises forming a preliminary particle by adhering one or more types of inorganic particles on at least a part of the surface area of a polymer particle, then, polycondensing at least one selected from among organosilicon compounds and organometal compounds in the presence of the above-mentioned preliminary particle.

21 Claims, 1 Drawing Sheet

METHOD OF PRODUCTION OF COMPOSITED PARTICLE, COMPOSITED PARTICLE PRODUCED BY THIS METHOD AND AQUEOUS DISPERSION FOR CHEMICAL MECHANICAL POLISHING CONTAINING THIS COMPOSITED PARTICLE, AND METHOD OF PRODUCTION OF AQUEOUS DISPERSION FOR CHEMICAL MECHANICAL POLISHING

BACKGROUND OF THE INVENTION

1. [Field of the Invention]

The present invention relates to a method for producing a composited particle, a composited particle produced by this method and an aqueous dispersion for chemical mechanical polishing containing the composited particles, and a method for producing an aqueous dispersion for chemical mechanical polishing.

2. [Description of the Prior Art]

As a polishing material used for chemical mechanical polishing such as element surfaces and interlayer insulation films in semiconductor devices and the like (which hereinafter may sometimes be referred to as "CMP"), an aqueous dispersion containing inorganic particles such as colloidal silica, colloidal alumina and the like is conventionally often used. However, this aqueous dispersion containing inorganic particles has low dispersion stability and tends to coagulate, and consequently, a defect occurs on a surface of polishing wafer (hereinafter, referred to as "scratch") by the coagulates, causing lowering of the yield. For solving this problem, there have been suggested various methods such as (1) a method in which a surfactant is compounded into an aqueous dispersion, (2) a method of uniform dispersion by a homogenizer and the like, (3) a method in which the coagulates are removed by a filter, and other methods. However, these methods do not improve a polishing material itself, and additionally, may also cause new problems such as reduction in polishing rate, staining of a surface of polishing wafer by a metal ion, and the like.

Recently, lowering of the dielectric constant of an interlayer insulation film aiming at improvement of the performance of VLSI is noticed. For this lowering of dielectric constant, there have been developed, in substitution for an $SiO_2$ film having a high dielectric constant, interlayer insulation films made of fluorine-added $SiO_2$ (dielectric constant: about 3.3 to 3.5), polyimide-based resins (dielectric constant: about 2.4 to 3.6, manufactured by Hitachi Chemical Co., Ltd., trade name: "PIQ", manufactured by Allied Signal Corp., trade name: "FLARE", and the like), benzocyclobutene (dielectric constant: about 2.7, manufactured by Dow Chemical Corp., trade name: "BCB", and the like), hydrogen-containing SOG (dielectric constant: about 2.5 to 3.5), organic SOG (dielectric constant: about 2.9, manufactured by Hitachi Chemical Co., Ltd., trade name: "HSGR7", and the like), and the like. However, these insulation films have lower mechanical strength, are soft and fragile as compared with an $SiO_2$ film, and therefore, when conventional aqueous dispersions containing an inorganic particle is used for CMP, disconnection of wiring may sometimes occur due to the generation of scratch and the like, inviting further lowering of the yield.

Further, Japanese Laid-open Patent Publication No. 86216 of 1995 discloses a method for polishing a working film of a semiconductor device with a polishing material containing not an inorganic particle but an abrasive particle mainly composed of organic polymer and the like. By this method, an abrasive particle remaining on a surface of polishing wafer after polishing can be burnt and removed, and occurrence of defects on products such as a semiconductor device and the like due to the remaining particle can be suppressed. However, it has a problem in that since a particle made of organic polymer has lower hardness as compared with an inorganic particle such as of silica, alumina and the like, polishing rate can not be increased sufficiently.

Furthermore, Japanese Patent Publication No. 40951 of 1994 discloses a method for producing a composite particle by mixing particles in which having the zeta potentials of opposite signs. However, in this method, since each particle adheres only by an electrostatic force, there is a possibility of separation of the particle when a large shearing stress is applied on the composite particle, and the like. Also, in this method, since the particles to be mixed have the zeta potentials of opposite signs, mixing speed should be controlled, a large coagulate may be formed depending on this speed, and this coagulate may give scratch in polishing, causing lowering of the yield of products.

SUMMARY OF THE INVENTION

[Problems to be Solved by the Invention]

An object of the present invention is to provide a method for producing composited particles in which inorganic particles which have been made composite are not released, composited particles produced by this method, and an aqueous dispersion for CMP containing these composited particles.

A further object of the present invention is to provide a method for producing an aqueous dispersion for CMP in which generation of coagulates in production is prevented.

[Features of the Invention]

According to the present invention, a method for producing composited particles, composited particles and an aqueous dispersion for CMP, and a method for producing an aqueous dispersion for CMP, having constitutions described below are provided to solve the above-mentioned objects.

[1] A method for producing a composited particle comprising forming a preliminary particle by adhering one or more types of inorganic particles on at least a part of the surface area of a polymer particle, then, polycondensing at least one selected from among organosilicon compounds and organometal compounds in the presence of said preliminary particle.

[2] The method for producing a composited particle according to [1] above, wherein said inorganic particle is adhered to said polymer particle via a connecting compound.

[3] The method for producing a composited particle according to [2] above, wherein said connecting compound is a silane coupling agent.

[4] The method for producing a composited particle according to [1] above, wherein said inorganic particle is of at least one selected from among alumina, titania and ceria.

[5] The method for producing a composited particle according to [4] above, wherein said polymer particle has at least one selected from among carboxyl groups, anions thereof, sulfonate groups and anions thereof.

[6] The method for producing a composited particle according to [4] above, wherein at least one selected from among negative surfactants and negative water-soluble polymers is adsorbed or chemically-bonded to said polymer particle.

[7] The method for producing a composited particle according to [1] above, wherein said inorganic particle is of at least one selected from among silica and zirconia.

[8] The method for producing a composited particle according to [7] above, wherein said polymer particle has at least one selected from among amino groups and cations thereof.

[9] The method for producing a composited particle according to [7] above, wherein at least one selected from among positive surfactants and positive water-soluble polymers is adsorbed or chemically-bonded to said polymer particle.

[10] The method for producing a composited particle according to [1] above, wherein said inorganic particle is adhered to said polymer particle by an electrostatic force.

[11] The method for producing a composited particle according to [10] above, wherein said inorganic particle is of at least one selected from among alumina, titania and ceria.

[12] The method for producing a composited particle according to [11] above, wherein said polymer particle has at least one selected from among carboxyl groups, anions thereof, sulfonate groups and anions thereof.

[13] The method for producing a composited particle according to [11] above, wherein at least one selected from among negative surfactants and negative water-soluble polymers is adsorbed or chemically-bonded to said polymer particle.

[14] The method for producing a composited particle according to [10] above, wherein said inorganic particle is of at least one selected from among silica and zirconia.

[15] The method for producing a composited particle according to [14] above, wherein said polymer particle has at least one selected from among amino groups and cations thereof.

[16] The method for producing a composited particle according to [8] above, wherein at least one selected from among positive surfactants and positive water-soluble polymers is adsorbed or chemically-bonded to said polymer particle.

[17] The method for producing a composited particle according to [1] above, wherein said composited particle is formed by adhering a plurality of said inorganic particles on the surface area of said polymer particle.

[18] The method for producing a composited particle according to [1] above, wherein said composited particle is formed by coating at least 5% of surface area of said polymer particle by said inorganic particle.

[19] The method for producing a composited particle according to [1] above, wherein the average particle size of said composited particle is from 0.05 to 0.5 $\mu$m, and at least 80% of said composited particle has particle sizes within a range of said average particle size±30%.

[20] A composited particle produced by a method according to any one of [1] to [19] above.

[21] An aqueous dispersion for chemical mechanical polishing, comprising composited particles produced by a method according to any one of [1] to [19] above.

[22] A method for producing an aqueous dispersion for chemical mechanical polishing, wherein the pH of an aqueous dispersion containing polymer particles and inorganic particles having the zeta potential of the same sign as that of said polymer particles is so changed that the zeta potential of said polymer particles and the zeta potential of said inorganic particles are of opposite signs, to form composite particles composed of said polymer particles and said inorganic particles.

[23] The method for producing an aqueous dispersion for chemical mechanical polishing according to [22] above, wherein said inorganic particles are of at least one selected from among alumina, titania and ceria.

[24] The method for producing an aqueous dispersion for chemical mechanical polishing according to [23] above, wherein said polymer particles have at least one selected from among carboxyl groups, anions thereof, sulfonate groups and anions thereof.

[25] The method for producing an aqueous dispersion for chemical mechanical polishing according to [23] above, wherein at least one selected from among negative surfactants and negative water-soluble polymers is adsorbed or chemically-bonded to said polymer particles.

[26] The method for producing an aqueous dispersion for chemical mechanical polishing according to [22] above, wherein said inorganic particles are of at least one selected from among silica and zirconia.

[27] The method for producing an aqueous dispersion for chemical mechanical polishing according to [26] above, wherein said polymer particles have at least one selected from among amino groups and cations thereof.

[28] The method for producing an aqueous dispersion for chemical mechanical polishing according to [26] above, wherein at least one selected from among positive surfactants and positive water-soluble polymers is adsorbed or chemically-bonded to said polymer particles.

[29] The method for producing an aqueous dispersion for chemical mechanical polishing according to any one of [22] to [28] above, wherein said composite particles are formed by coating at least 5% of the surface area of said polymer particles by said inorganic particles.

[30] The method for producing an aqueous dispersion for chemical mechanical polishing according to any one of [22] to [29] above, wherein the average particle size of said composite particles is from 0.05 to 0.5 $\mu$m, and at least 80% of said composite particles have particle sizes within a range of said average particle size±30%.

[Effect of the Invention]

According to a method for producing a composited particle described in herein, composited particle can be obtained which is composed of a polymer particle and an inorganic particle, the surface of which has sufficient strength and hardness, which is excellent in heat resistance and is appropriately soft, and in which an inorganic particle which has been made composite is not released. A composited particle of described herein produced by the above-mentioned method is useful in CMP such as working films of a semiconductor device and the like since this particle has the above-mentioned properties. Further, according to an aqueous dispersion for CMP described herein containing a composited particle produced by the above-mentioned method, the polishing rate of a working film can be increased, and also when applied to a surface of polishing wafer carrying an interlayer insulation film having lower strength, the occurrence of scratch, disconnection of wiring, and the like can be suppressed.

According to a method for producing an aqueous dispersion for CMP described herein, the yield of a product is high since generation of coagulates in production is prevented. Further, the resulted aqueous dispersion for CMP contains composite particles composed of polymer particles and inorganic particles, can increase the polishing rate of working films, and at the same time, can suppress generation of scratch, disconnection of wiring and the like also when applied to a surface of polishing wafer carrying an interlayer insulation film having lower strength.

DETAILED DESCRIPTION OF THE INVENTION

As the above-mentioned "polymer particle", there can be used polymer particles composed of thermoplastic resins such as (1) polystyrene and styrene-based copolymers, (2) (meth)acrylic resins such as polymethyl methacrylate and the like, and acrylic copolymers, (3) polyvinyl chloride, polyacetal, saturated polyester, polyamide, polyimide, polycarbonate, phenoxy resins, and (4) polyolefins and olefin-based copolymers such as polyethylene, polypropylene, poly-1-butene, poly-4-methyl-1-pentene and the like.

Further, as this polymer particle, there can be used those composed of a polymer having a crosslinked structure, obtained by copolymerizing styrene, methyl methacrylate and the like with divinylbenzene, ethylene glycol dimethacrylate and the like. The hardness of a polymer particle can be controlled by extent of this crosslinking. Further, there can also be used polymer particles composed of thermosetting resins such as phenol resin, urethane resin, urea resin, melamine resin, epoxy resin, alkyd resin, unsaturated polyester resin and the like.

As the polymer particle, those composed of modified polymers obtained by polycondensing an alkoxysilane and a metal alkoxide with various polymers can be used. As this alkoxysilane, tetramethoxysilane, tetraethoxysilane, methyltrimethoxysilane, methyltriethoxysilane, dimethyldiethoxysilane and the like can be used.

These polymer particles may be used one type alone or in combinations of two types or more.

It is preferable that the polymer particles used for forming these composited particles and/or composite particles (hereinafter, may also referred to as composite(d) particles) have spherical form. This spherical form also means that which is approximately spherical having no acute angle part, and need not be a nearly true sphere. By using spherical polymer particles, composite(d) particles to be formed are also spherical, and when these composite(d) particles are used as an abrasive for a CMP slurry, polishing can be conducted at the sufficient rate, and occurrence of scratch, disconnection of wiring, and the like at a surface of polishing wafer can also be suppressed.

As the above-mentioned "inorganic particle", inorganic particles composed of oxides of silicon or metal element, such as alumina, titania, ceria, silica, zirconia, iron oxide, manganese oxide and the like can be used.

These inorganic particles may be used one type alone or in combinations of two types or more.

A compound represented by the following formula (1) can be used as the above-mentioned organosilicon compound and the above-mentioned organometal compound.

$(R^1)_n M(OR^2)_{z-n}$ (1)

In this formula (1), M is selected from among Al, Si, Ti, V, Cr, Mn, Fe, Co, Ni, Cu, Zn, Ge, Zr, Nb, Mo, Sn, Sb, Ta, W, Pb or Ce, and z is the valency of M. $R^1$ is a monovalent organic group having 1 to 8 carbon atoms, and $R^2$ is an alkyl group having 1 to 6 carbon atoms, an acyl group having 1 to 6 carbon atoms or an aryl group having 6 to 10 carbon atoms. n is an integer of 0 to (z-1), and when n is two or more, $R^1$s may be the same or different. While when (z-n) is two or more, $R^2$s may be the same or different.

As $R^1$, alkyl groups such as a methyl group, ethyl group, n-propyl group, iso-propyl group, n-butyl group, sec-butyl group, tert-butyl group, n-pentyl group and the like, and monovalent organic groups such as a phenyl group, vinyl group, glycidopropyl group and the like, are listed. As $R^2$, alkyl groups such as a methyl group, ethyl group, n-propyl group, iso-propyl group and the like, acyl groups such as an acetyl group, propionyl group, butyryl group, valeryl group, caproyl group and the like, aryl groups such as a phenyl group, tolyl group and the like, are listed.

M is particularly preferably Al, Si, Ti or Zr. Specific examples of compounds in which M represents these elements will be exemplified below.

(a) Compounds in which M is Si

As the compound in which M is Si, there can be used tetramethoxysilane, tetraethoxysilane, tetra-n-propoxysilane, tetra-iso-propoxysilane, tetra-n-butoxysilane, tetra-isobutoxysilane, methyltrimethoxysilane, methyltriethoxysilane, ethyltrimethoxysilane, ethyltriethoxysilane, n-propyltrimethoxysilane, n-propyltriethoxysilane, iso-propyltrimethoxysilane, iso-propyltriethoxysilane, n-butyltrimethoxysilane, iso-butyltrimethoxysilane, γ-chloropropyltrimethoxysilane, γ-chloropropyltriethoxysilane, 3,3,3-trifluoropropyltrimethoxysilane, 3,3,3-trifluoropropyltriethoxysilane, γ-glycidoxypropyltrimethoxysilane, γ-glycidoxypropyldimethoxyalkylsilane, γ-glycidoxypropyltriethoxysilane, γ-glycidoxypropyldiethoxyalkylsilane, γ-methacryloxypropyltrimethoxysilane, γ-methacryloxypropyltriethoxysilane, γ-mercaptopropyltrimethoxysilane, γ-mercaptopropyltriethoxysilane, γ-mercaptopropyltrimethoxysilane, γ-aminopropyltrimethoxysilane, γ-aminopropyltriethoxysilane, γ-aminopropyltrimethoxysilane, vinyltrimethoxysilane, vinyltriethoxysilane, phenyltrimethoxysilane, phenyltriethoxysilane, 3,4-epoxycyclohexylethyltrimethoxysilane, 3,4-epoxycyclohexylethyltriethoxysilane, dimethyldimethoxysilane, dimethyldiethoxysilane, diethyldimethoxysilane and the like.

(b) Compounds in which M is Ti

As the compound in which M is Ti, there can be used organotitanium compounds such as teramethoxytitanium, tetraethoxytitanium, tetrapropoxytitanium, tetrabutoxytitanium, tetratrimethoxytitanium, methyltriethoxytitanium and the like.

(c) Compounds in which M is Al

As the compound in which M is Al, there can be used organoaluminum compounds such as triethoxyaluminum, tripropoxyaluminum and the like.

(d) Compounds in which M is Zr

As the compound in which M is Zr, there can be used organozirconium compounds such as tert-butoxyzirconium and the like.

Of these organosilicon compounds and organometal compounds, tetramethoxysilane, tetraethoxysilane, tetra-iso-propoxysilane, methyltrimethoxysilane, methyltriethoxysilane, γ-glycidoxypropyltrimethoxysilane, γ-glycidoxypropyltriethoxysilane, vinyltrimethoxysilane, vinyltriethoxysilane, dimethyldiethoxysilane, diethyldimethoxysilane and the like are preferable.

These compounds may be used alone or in combinations of two or more.

Further, not only compounds represented by the above-mentioned formula (1) but also, for example, at least one of hydrolysates and partial condensates of these compounds can be used. A compound represented by the above-mentioned formula (1) is hydrolyzed or partially condensed without requiring particular operation, and if necessary, that in which a desired proportion thereof has been previously hydrolyzed or partially condensed can also be used as the above-mentioned organosilicon compound or the above-mentioned organometal compound.

The above-mentioned organosilicon compound or the above-mentioned organometal compound is polycondensed in the presence of "preliminary particles" prepared by adhesion of inorganic particles to the surface of polymer particles in, for example, an aqueous dispersion in which these preliminary particles are dispersed, to produce "composited particles".

The polycondensation of the above-mentioned organosilicon compound or the above-mentioned organometal compound (hereinafter, referred to also as "organosilicon compound and the like") can be conducted by controlling the pH of the above-mentioned aqueous dispersion from 2 to 10 (preferably, from 3 to 9.5, more preferably, from 3 to 9), adding the above-mentioned compound to the dispersion, raising the temperature thereof to 30° C. or more (preferably, 30 to 90° C., more preferably, 40 to 80° C.), and stirring the mixture for 0.1 to 10 hours. The addition amount of the above-mentioned organosilicon compound and the like may be from 0.5 to 100 parts by weight (hereinafter, abbreviated as "parts"), preferably from 1 to 60 parts based on 100 parts of a preliminary particle.

Since this polycondensation progresses by hydrolysis of a group represented by $R^2$ in the above-described formula (1), and by the subsequent dehydration condensation, it is necessary that water is present in the polycondensation system. Therefore, when a poor solvent used in an aqueous dispersion is other than water, water is usually added so that water exists in an amount of 1% by weight (hereinafter referred to as "wt %") or more, preferably 10 wt % or more in the polycondensation system, though this amount depends on the kind of the solvent.

When the polycondensation reaction is initiated from a functional group such as a hydroxyl group, carboxyl group, amino group, epoxy group or the like carried on a polymer particle or from a functional group such as a hydroxyl group or the like carried on an inorganic particle, as a starting point, the above-mentioned "composited particle" in which a polycondensate to be produced is chemically bonded to the polymer particle or inorganic particle is formed. Further, in a method for producing a composited particle of the present invention, this polycondensate is not necessarily required to be chemically bonded to a polymer particle and the like, and for example, a three-dimensionally grown polycondensate may be physically adhered to the surface of a polymer particle and the like.

As the specific method for forming a preliminary particle by adhering an inorganic particle to a polymer particle, the following methods are preferably used.

(A) A method in which an inorganic particle is adhered to a polymer particle via a connecting compound as described herein.

(B) A method in which an inorganic particle is adhered to a polymer particle by an electrostatic force as described herein.

Herein, "adhereing" is intended to include chemicaly bonding. It is preferable that a polymer particle and an inorganic particle constituting a preliminary particle are chemically bonded.

The above-mentioned methods (A) and (B) will be explained in detail below.

The connecting compound in the above-mentioned method (A) is used to present between a polymer particle and an inorganic particle and connect them. As this connecting compound, there can be used a coupling agent such as a silane coupling agent, aluminum-based coupling agent, titanium-based coupling agent, zirconium-based coupling agent, and the like, and a silane coupling agent is particularly preferable. As this silane coupling agent, the following (i), (ii) and (iii) and the like are listed.

(i) vinyltrichlorosilane, vinyltris(β-methoxyethoxy)silane, vinyltriethoxysilane, vinyltrimethoxysilane, γ-methacryloxypropyltrimethoxysilane, γ-mercaptopropyltrimethoxysilane, γ-chloropropyltrimethoxysilane and the like, (ii) γ-glycidoxypropyltrimethoxysilane, γ-glycidoxypropylmethyldiethoxysilane and the like, (iii) N-β (aminoethyl) γ-aminopropyltrimethoxysilane, N-β(aminoethyl) γ-aminopropylmethyldimethoxysilane, γ-aminopropyltriethoxysilane and the like.

As these silane coupling agents, those having a functional group in the molecule which can easily react with various functional groups carried on a polymer particle are preferable. For example, in the case of a polymer particle having a carboxyl group, the silane coupling agents (ii) and (iii) having an epoxy group or amino group are preferable. Of them, γ-glycidoxypropyltrimethoxysilane and N-β (aminoethyl) γ-aminopropyltrimethoxysilane are particularly preferable.

As the aluminum-based coupling agent, acetoalkoxyaluminum diisopropylate and the like are listed. Further, as the titanium-based coupling agent, isopropyltriisostearoyl titanate, isopropyltridecylbenzenesulfonyl titanate, and the like are listed. These various coupling agents may be used each alone or in combinations of two or more. Also, a different type of coupling agent can be used together.

The amount of a coupling agent used that intervenes between a polymer particle and an inorganic particle is preferably from 0.1 to 50 mol, more preferably from 0.5 to 30 mol and further preferably from 1.0 to 20 mol based on 1 mol of a functional group carried on or introduced to the polymer particle. When the amount of this coupling agent used is less than 0.1 mol, the inorganic particle is not bonded sufficiently strongly to the polymer particle, and for example, when used as an aqueous dispersion for CMP, the inorganic particle tends to fall from the polymer particle in polishing, which is undesirable. On the other hand when the amount used is over 50 mol, polycondensation reaction among the coupling agent may progress, a new type of polymer may be produced in addition to the reaction with a polymer constituting the polymer particle, and bonding of the inorganic particle to the polymer particle may be prevented. When this coupling agent is chemically bonded to a polymer particle, a catalyst such as an acid and base and the like can also be used for promoting the reaction. Further, the reaction can also be promoted by heating the reaction system.

The reaction for producing a preliminary particle using a coupling agent can be conducted in a dispersion system in which various organic solvents such as water, alcohol and the like are used as a dispersing medium. First, a polymer particle and a coupling agent are dispersed in a dispersing medium, and the mixtures is stirred for 0.1 to 6 hours at a temperature from 20 to 90° C., particularly from 30 to 80° C., to allow the coupling agent to be bonded to the polymer particle. Thereafter, an inorganic particle can be added in the dispersion system and the mixture can be stirred for chemically bonding the inorganic particle via a siloxane bond, methalloxane bond or the like. After the reaction, an organic solvent such as alcohol and the like can be removed by an evaporator and the like.

Next, the above-mentioned method (B), namely a method in which an inorganic particle is adhered to a polymer particle by an electrostatic force owing to difference in zeta potential between the polymer particle and the inorganic particle, to form a preliminary particle will be illustrated in detail below.

The zeta potential of the polymer particle is often negative over the whole pH range, or a wide range excepting the lower pH regions, and the polymer particle can more surely obtain a negative zeta potential by allowing the polymer particle to have a specific functional group. Further, a polymer particle having a positive zeta potential in a specific pH range can be formed, depending on the kind of functional group. Further, the zeta potential can also be controlled by allowing an ionic surfactant or water-soluble polymer to be adsorbed on the polymer particle.

On the other hand, the zeta potential of the inorganic particle has high pH dependency, has an isoelectric point at which this potential is zero, and the sign of zeta potential in pH ranges around this point is inverted.

Therefore, an inorganic particle can be adhered to a polymer particle by an electrostatic force by combining a specific polymer particle with a specific inorganic particle and mixing them in a pH range wherein the zeta potentials thereof obtain the opposite signs.

The inorganic particle may be at least one selected from among alumina particles, titania particles and ceria particles. There may be used a polymer particle so controlled that zeta potential is negative over approximately the whole pH range by a specific functional group or a negative ion thereof. Then, a preliminary particle can be formed easily by the inorganic particle and the polymer particle.

As the polymer particle so controlled that the zeta potential is negative over approximately the whole pH range, there can be used those composed of a polymer obtained by introducing at least one selected from among carboxyl groups, anions thereof, sulfonic groups and anions thereof into a polymer chain. These functional groups and negative ions can be introduced into a polymer by using a monomer such as (meth)acrylic acid, itaconic acid, fumaric acid, maleic acid and the like in an amount of 0.01 to 50 parts, preferably 0.1 to 30 parts based on 100 parts of the total amount of monomer. Further, they can also be introduced by using a polymerization initiator such as sodium persulfate, potassium persulfate, ammonium persulfate and the like in an amount of 0.01 to 30 parts, preferably 0.1 to 20 parts based on 100 parts of the monomer amount.

An aqueous dispersion containing these polymer particles and inorganic particles (aqueous dispersion in which preliminary particles or composited particles are dispersed in an aqueous medium) is controlled within a pH range wherein the zeta potential of the inorganic particle is positive, namely, a range situated at a more acidic side than the isoelectric point. The pH of this aqueous dispersion is preferably controlled in a lower range less than the isoelectric point, and in such a lower pH range, the zeta potential of the inorganic particle increases, and the inorganic particles are more strongly adhered to the polymer particle. Further, in the case of use of the resulted composited particle as an abrasive for a CMP slurry, also when a fairly large shearing stress is applied on this composited particle, these particles are not easily separated. When used in a more basic side than the isoelectric point of the inorganic particle, the zeta potential of the inorganic particle becomes negative, adhesion of the polymer particle and the inorganic particle is weakened, and these particles may be separated before polycondensation and bonding of organosilicon compound and the like, and even after bonding, these particles may be separated by receiving a large shearing stress.

On the other hand, in a polymer particle having a zeta potential controlled to surely manifest a negative sign, the zeta potential increases with the lowering of the pH (absolute values decrease on negative side). Therefore, too low pH ranges are not preferable, and it is preferable that the pH is 2 or more, and further, 3 or more.

From the above-mentioned standpoint, it is more preferable that the pH of this aqueous dispersion is from 2 to 9, particularly from 3 to 8, further from 3 to 7 when an alumina particle or ceria particle is used as an inorganic particle. Further, when titania is used as an inorganic particle, it is more preferable that the pH of this aqueous dispersion is from 2 to 6, particularly from 3 to 5.

A polymer particle may be used to which at least one selected from among negative surfactants and negative water-soluble polymers is adsorbed or chemically-bonded, and of which the zeta potential is controlled to manifest a negative sign is used. A preliminary particle can be formed easily using this polymer particle.

As the negative surfactant, alkali metal salts of a higher alcohol sulfate ester, alkali metal salts of an alkylbenzenesulfonic acid, alkali metal salts of a dialkyl succinate sulfonic acid, alkali metal salts of an alkyldiphenyl ether disulfonic acid, sulfate ester salts of a polyoxyethylenealkyl (or alkyl phenyl ether), and the like, and additionally, reactive emulsifiers and the like can be used.

As the negative water-soluble polymer, polyacrylic acid, polymethacrylic acid, polymethylmethacrylic acid, polymaleic acid, saturated or unsaturated polycarboxylic acids having an acidic group such as a carboxyl group and the like, and water-soluble polymers having a phosphate group, sulfonate group; and the like are listed. It is preferable that the molecular weight of these negative water-soluble polymers is from 10 to 100000, particularly from 100 to 50000.

It is preferable that the amount of compounding of the negative surfactant and/or negative water-soluble polymer is from 0.01 to 50 wt %, particularly from 0.05 to 40 wt %, further from 0.1 to 30 wt % based on a polymer particle.

The negative surfactant and negative water-soluble polymer may be used in preparing a polymer particle to be previously adsorbed or chemically bonded to the polymer particle, or may be adsorbed or chemically bonded to a polymer particle after preparation of the polymer particle, by mixing to stir this polymer particle with the negative surfactant and/or negative water-soluble polymer.

Preparation of an aqueous dispersion containing these preliminary particles can be conducted in the same manner as for an aspect described herein.

The inorganic particle may be at least one selected from among silica particles and zirconia particles. A polymer particle of which the zeta potential is so controlled to manifest a positive sign over a specific pH range by using a specific functional group or cation thereof may be used. A preliminary particle can be easily formed by this inorganic particle and polymer particle.

As this polymer particle of which the zeta potential is so controlled to manifest a positive sign, a particle composed of a polymer comprising a polymer chain into which at least one selected from among amino groups and cations thereof has been introduced can be used. These functional groups and cations can be introduced into a polymer by using a monomer such as (meth)acryldimethylaminoethyl, (meth)acryldiethylaminoethyl and the like in an amount of 0.01 to 50 parts, preferably of 0.1 to 30 parts based on 100 parts of the total amount of monomer. They can also be introduced by using a polymerization initiator such as 2,2'-azobis(2-aminopropane) hydrochloride and the like in an amount of 0.01 to 30 parts, preferably of 0.1 to 20 parts based on 100 parts of the total amount of monomer.

An aqueous dispersion containing these polymer particles and inorganic particles (aqueous dispersion in which preliminary particles or compounded particles are dispersed in an aqueous medium) is used while controlling the pH in a range wherein the zeta potential of the inorganic particle is negative, namely, in a range which is on a more basic side than the isoelectric point. It is preferable that the pH of this aqueous dispersion is controlled in higher ranges over the isoelectric point, and in such a higher pH range, the zeta potential of the inorganic particle decreases (absolute values increases on negative side), and the inorganic particles are adhered more strongly to the polymer particle. Further, in the case of use of the resulted composited particle as an abrasive for a CMP slurry, also when a fairly large shearing stress is applied on the composited particle in polishing, these particle are not easily separated. When used in a more acidic range than the isoelectric point of the inorganic particle, the zeta potential of the inorganic particle becomes positive, adhesion of the polymer particle and the inorganic particle which is weakened, and these particles may be separated before polycondensation and bonding of organosilicon compound and the like , and even after bonding, these particles may be separated by receiving a large shearing stress.

On the other hand, in a polymer particle having a zeta potential controlled to surely manifest a positive sign by using a specific functional group, pH increases and simultaneously, the zeta potential decreases (absolute values decreases on positive side). Therefore, too high pH ranges are not preferable, and it is preferable that the pH is 8 or less, further, 7 or less.

From the above-mentioned standpoint, it is more preferable that the pH of this aqueous dispersion is from 3 to 10, particularly from 3 to 8 when a silica particle is used as an inorganic particle. Further, when zirconia is used as an inorganic particle, it is more preferable that pH of this aqueous dispersion is from 4 to 10, particularly from 5 to 8.

A polymer particle may be used to which at least one selected from among positive surfactants and positive water-soluble polymers is adsorbed or chemically-bonded, and of which the zeta potential is controlled to manifest a positive sign is used. A preliminary particle can be formed easily using this polymer particle.

As the positive surfactant, alkylpyridinyl chloride, alkylammonium chloride and the like can be used.

As the positive water-soluble polymer, water-soluble polymers having an amino group, amide group or imide group, and further, a nitrogen-containing basic group such as vinylpyridine, piperidine, pirerazine and the like can be used. It is preferable that the molecular weight of these positive water-soluble polymer is from 10 to 100000, particularly from 100 to 50000.

It is preferable that the compounding amount of the positive surfactant and/or positive water-soluble polymer is from 0.01 to 50 wt %, particularly from 0.05 to 40 wt %, further from 0.1 to 30 wt % based on a polymer particle.

The adsorption or chemical bonding of the positive surfactant and positive water-soluble polymer to polymer particles can be conducted in the same manner as for an aspect described herein. Preparation of an aqueous dispersion containing these preliminary particles can be conducted in the same manner as for an aspect described herein.

When preliminary particles are formed by an electrostatic force, it is also possible to adhere an inorganic particle to a polymer particle by mixing the polymer particle and inorganic particle in a pH range wherein the zeta potentials thereof have the same sign, thereafter, by changing the pH of this mixture so that the zeta potential of said polymer particles and the zeta potential of said inorganic particles are of opposite signs, by utilizing the pH dependency of the zeta potential of the inorganic particle.

"Composite particles" composed of inorganic particles and organic particles may be formed by utilizing this reversal of the sign of the zeta potential by the pH, to produce an aqueous dispersion for CMP containing the composite particles. Namely, an aqueous dispersion containing polymer particles and inorganic particles having zeta potentials of the same sign is prepared, then, change the pH of this aqueous dispersion so that zeta potential of the polymer particles and zeta potential of the inorganic particles are of opposite signs to form composite particles composed of the polymer particles and the inorganic particles. According to this method, since the polymer particles and the inorganic particles have zeta potentials of the same sign in preparing the above-mentioned aqueous dispersion, generation of coagulates in the mixing thereof is prevented.

At least one selected from among alumina particles, titania particles and ceria particles may be used as inorganic particles. Further, polymer particles having a zeta potential so controlled as to manifest a negative sign over approximately the whole pH range by using a specific functional group or anion thereof may be used. By using these particles, composite particles can be formed easily by changing the pH.

As the polymer particle having a zeta potential so controlled as to manifest a negative sign over approximately the whole pH range, a particle composed of a polymer comprising a polymer chain into which at least one selected from among carboxyl groups, anions thereof, sulfonate groups and anions thereof has been introduced can be used. These functional groups and anions can be introduced into a polymer by using a monomer such as (meth)acrylic acid, itaconic acid, fumaric acid, maleic acid and the like in an amount of 0.01 to 50 parts, preferably of 0.1 to 30 parts based on 100 parts of the total amount of monomer. They can also be introduced by using a polymerization initiator such as sodium persulfate, potassium persulfate, ammonium persulfate and the like in an amount of 0.01 to 30 parts, preferably of 0.1 to 20 parts based on 100 parts of the total amount of monomer.

This aqueous dispersion for CMP can be produced by mixing polymer particles and inorganic particles in a range situated on a more alkaline side than the isoelectric point of the inorganic particles, namely, in pH range wherein zeta potential of the inorganic particles is negative, then, converting pH into the more acidic side than the isoelectric point of the inorganic particles, to render zeta potential of the inorganic particles positive. pH range when the polymer particles and the inorganic particles are mixed is, in the case of alumina particles and a ceria particles, 9 or more, preferably from 10 to 12, and in the case of titania particles, 7 or more, preferably from 8 to 12.

It is preferable that pH in use is controlled in a lower range that is less than the isoelectric point of the inorganic particles. In such a lower pH range, zeta potential of the inorganic particles increases on the positive side, and the inorganic particles are more strongly adhered to the polymer particles, and also when a fairly large shearing stress is applied on composite particles when polishing, the inorganic particles are not easily separated from the polymer particles. When used at a more alkaline side than the isoelectric point of the inorganic particles, the zeta potential of the inorganic particles remains negative, and desired composite particles can not be formed.

On the other hand, in polymer particles having a zeta potential controlled to surely manifest a negative sign, pH decreases and simultaneously, the zeta potential increases (absolute values decreases on negative side). Therefore, pH ranges that are too low are not preferable, and it is preferable that pH is 2 or more, and further, 3 or more.

From the above-mentioned standpoint, it is more preferable that pH of this aqueous dispersion is from 2 to 9, particularly from 3 to 8, furthere 3 to 7 when alumina particles are used as inorganic particles. Further, when titania particles are used as inorganic particles, it is more preferable that pH of this aqueous dispersion is from 2 to 6, particularly from 3 to 5.

Polymer particles may be used to which at least one selected from among negative surfactants and negative water-soluble polymers is adsorbed or chemically-bonded, and of which zeta potential is controlled to manifest a negative sign is used. By using these polymer particles, composite particles can be formed easily by changing pH.

As the negative surfactant, alkali metal salts of a higher alcohol phosphate ester, alkali metal salts of an alkylbenzenesulfonic acid, alkali metal salts of a dialkyl succinate sulfonic acid, alkali metal salts of an alkyldiphenyl ether disulfonic acid, sulfate ester salts of a polyoxyethylenealkyl (or alkyl phenyl ether), and the like, and additionally, reactive emulsifiers and the like can be used.

As the negative water-soluble polymer, polyacrylic acid, polymethacrylic acid, polymethylmethacrylic acid, polymaleic acid, saturated or unsaturated polycarboxylic acids having an acidic group such as a carboxyl group and the like, and water-soluble polymers having a phosphate group, sulfonate group; and the like are listed. It is preferable that the molecular weight of these negative water-soluble polymers is from 10 to 100000, particularly from 100 to 50000.

It is preferable that the compounding amount of the negative surfactant and/or negative water-soluble polymer is from 0.01 to 50 wt %, particularly from 0.05 to 40 wt %, further from 0.1 to 30 wt % based on a polymer particle.

The negative surfactant and negative water-soluble polymer may be used in preparing polymer particles to be previously adsorbed or chemically bonded to the polymer particles, or may be adsorbed or chemically bonded to a polymer particle after preparation of the polymer particle, by mixing to stir this polymer particle with the negative surfactant and/or negative water-soluble polymer.

Preparation of an aqueous dispersion for CMP containing these composite particles can be conducted in the same manner as for an aspect described herein.

At least one selected from among silica particles and zirconia particles may be used as inorganic particles. Polymer particles may be used having a zeta potential so controlled as to manifest a positive sign in a specific pH range by using a specific functional group or cation thereof. By using these particles, a composite particles can be formed easily by changing pH.

As this polymer particle of which zeta potential is so controlled to manifest a positive sign, a particle composed of a polymer comprising a polymer chain into which at least one selected from among amino groups and cations thereof has been introduced can be used. These functional groups and cations can be introduced into a polymer by using a monomer such as (meth)acryldimethylaminoethyl, (meth) acryldiethylaminoethyl and the like in an amount of 0.01 to 50 parts, preferably of 0.1 to 30 parts based on 100 parts of the total amount of monomer. They can also be introduced by using a polymerization initiator such as 2,2'-azobis(2-aminopropane) hydrochloride and the like in an amount of 0.01 to 30 parts, preferably of 0.1 to 20 parts based on 100 parts of the total amount of monomer.

This aqueous dispersion for CMP can be produced by mixing polymer particles and inorganic particles in a range situated on a more acidic side than the isoelectric point of the inorganic particles, namely, in a pH range wherein the zeta potential of the inorganic particles is positive, then, converting the pH into a more alkaline side than the isoelectric point of the inorganic particles, to render zeta potential of the inorganic particles negative. The pH range when the polymer particles and the inorganic particles are mixed is, in the case of silica particles, 2 or less, preferably 1.5 or less, and in the case of zirconia particles, 3 or less, preferably 2 or less.

It is preferable that the pH in use is controlled in a range higher than the isoelectric point of the inorganic particles. In such a higher pH range, the zeta potential of the inorganic particles decreases (absolute value increases on negative side), and the inorganic particles are more strongly adhered to the polymer particles, and also when a fairly large shearing stress is applied on composite particles in polishing, the inorganic particles are not easily separated from the polymer particles. When used on a more acidic side than the isoelectric point of the inorganic particles, the zeta potential of the inorganic particles remains positive, and desired composite particles can not be formed.

On the other hand, in polymer particles having a zeta potential controlled to manifest a positive sign, the pH increases and simultaneously, the zeta potential decreases (absolute values decreases on the positive side). Therefore, too high pH ranges are not preferable, and it is preferable that the pH is 8 or less, further, 7 or less.

From the above-mentioned standpoint, it is more preferable that the pH of this aqueous dispersion is from 3 to 10, particularly from 3 to 8 when silica particles are used as inorganic particles. Further, when zirconia particles are used as inorganic particles, it is more preferable that the pH of this aqueous dispersion is from 4 to 10, particularly from 5 to 8.

Polymer particles to which at least one selected from among positive surfactants and positive water-soluble polymers is adsorbed or chemically-bonded, and of which the zeta potential is controlled to manifest a positive sign may be used. By using these polymer particles, composite particles can be formed easily by changing the pH.

As the positive surfactant, alkylpyridinyl chloride, alkylammonium chloride and the like can be used.

As the positive water-soluble polymer, water-soluble polymers having an amino group, amide group or imide group, and further, a nitrogen-containing basic group such as vinylpyridine, piperidine, pirerazine and the like can be used. It is preferable that the molecular weight of these positive water-soluble polymers is from 10 to 100000, particularly from 100 to 50000.

It is preferable that the compounding amount of the positive surfactant and/or positive water-soluble polymer is from 0.01 to 50 wt %, particularly from 0.05 to 40 wt %, further from 0.1 to 30 wt % based on a polymer particle.

The adsorption or chemical bonding of the positive surfactant and positive water-soluble polymer to polymer particles can be conducted in the same manner as for an aspect described herein. Preparation of an aqueous dispersion for CMP containing thus prepared composite particles can be conducted in the same manner as for an aspect described herein.

In the resulting a composited particle, plurality of (particularly, fairly plurality of) inorganic particles may be adhered on the surface of a polymer particle.

The average particle sizes of a polymer particle and an inorganic particle constituting the composite(d) particle of the present invention can be from 0.005 to 5 μm, preferably from 0.01 to 3 μm, more preferably from 0.01 to 1 μm. For efficiently forming a composite(d) particle, it is preferable that the average particle size of the polymer particle is larger than that of the inorganic particle, and that the ratio of the average particle size of the polymer particle (Sp) to the average particle size of the inorganic particle (Si), namely, Sp/Si is from 1 to 200 (more preferably from 1.5 to 150, further preferably from 2 to 100).

By thus combining a polymer particle having a larger average particle size and an inorganic particle having a smaller average particle size, a preliminary particle or a composite(d) particle in which more many inorganic particles are adhered on the surface of the polymer particle can be formed easily. If Sp/Si is less than 1, when this composite (d) particle is used as an abrasive particle for CMP slurry, almost the inorganic particles only are in contact with a surface of polishing wafer, and scratch, disconnection of wiring and the like may occur. On the other hand, if Sp/Si is over 200, the polishing rate tends to decrease, which is undesirable.

Further, the average particle size of a composite(d) particle is preferably from 0.02 to 20 μm, more preferably from 0.02 to 10 μm, further preferably from 0.02 to 5 μm, and particularly preferably from 0.02 to 2 μm. If this average particle size is less than 0.02 μm, when used as an abrasive particle for CMP slurry, reduction in the polishing rate and the like are invited, and desired properties may not be obtained, which is undesirable. On the other hand, if the average particle size is over 20 μm, a composite(d) particle tends to precipitate, and a stable aqueous dispersion is not easily obtained.

The average particle size can be measured by observing particles by a transmission electron microscope.

Further, the weight ratio of a polymer particle to an inorganic particle in a composite(d) particle is not particularly restricted, and it is preferable that the weight ratio of the polymer particle (Wp) to the inorganic particle (Wi), namely Wp/Wi is from 0.1 to 200, particularly from 0.2 to 100, further from 0.5 to 70. When the weight ratio of a polymer particle to an inorganic particle is within this range, efficient polishing is conducted at a sufficient rate, and the occurrence of scratch on a surface of polishing wafer, the disconnection of wiring, and the like is also suppressed. When this Wp/Wi is less than 0.1, scratch and the like may sometimes occur. On the other hand, when Wp/Wi is over 200, the polishing rate tends to decrease, which is undesirable.

The proportion of area of a polymer particle coated with an inorganic particle may be defined. In an aqueous dispersion for CMP containing this specific composite(d) particles, the occurrence of scratch, and disconnection of wiring and the like can be more surely suppressed.

The ratio of area coated with an inorganic particle to the surface area of a polymer particle is preferably 5% or more, more preferably 10% or more, and it can also be 20% or more. Such a specific composite(d) particle can be easily formed particularly when Sp/Si is within the above-mentioned preferable range. This surface area or area does not include concave and convex and the like on the surface of a polymer particle, but shall be an area of smooth surfaces circumscribed on the surface.

The proportion of area coated with inorganic particle in the surface area of a polymer particle can be calculated by observing a composite(d) particle by a scanning electron microscope and the like, photographing it, measuring the area coated with an inorganic particle, and using a formula: [coated area/(coated area+non-coated area)]×100.

If the proportion of area coated with an inorganic particle in the surface area of a polymer particle is less than 5%, a sufficient polishing rate may not be obtained when this composite(d) particle is used as an abrasive particle for CMP slurry.

The average particle size and particle size distribution of a composite(d) particle may be defined. An aqueous dispersion for CMP containing this composite(d) particle is useful especially when an insulation film of lower dielectric constant having small mechanical strength is used, since the occurrence of scratch, disconnection of wiring and the like is suppressed sufficiently and reduction in the yield is small.

It is preferable that the average particle size of a composite (d) particle is from 0.05 to 0.5 μm, particularly from 0.05 to 0.4 μm, further from 0.07 to 0.35 μm. When this average particle size is less than 0.05 μm, reduction in the polishing rate and the like are invited, and desired properties may not be obtained, which is undesirable. On the other hand, when the average particle size is over 0.5 μm, scratch, disconnection of wiring and the like tend to occur.

Further, regarding the particle size of a composite(d) particle, it is preferable that 80% or more (more preferably 90% or more) of all the particles is distributed within ±30% (more preferably within ±20%) of the average particle size. Thus, in an aqueous dispersion for CMP containing a composite(d) particle having a narrow particle size distribution, a sufficient polishing rate is obtained stably, and the occurrence of scratch, disconnection of wiring and the like is more surely suppressed.

The particle size of a composite(d) particle can be measured by observing this composite(d) particle by a transmission electron microscope, and the average particle size can be obtained by observing a plurality of composite(d) particles and calculating from the accumulated particle size and the number of the particle.

A composited particle is produced by a method described herein, and is formed by polycondensation of at least one of an organosilicon compound and an organometal compound in the presence of a preliminary particle in which one or more types of inorganic particles are adhered on at least a part of the surface of a polymer particle. Therefore, this composited particle does not cause release of an inorganic particle adhered on a polymer particle even if a large shearing force is applied, and when used as an abrasive particle for CMP slurry, this composited particle can polish an element surface and interlayer insulation film of a semiconductor device and the like at sufficient rate.

An aqueous dispersion for CMP may contain composited particles produced by a method described herein.

In an aqueous dispersion for CMP described herein, or an aqueous dispersion for CMP obtained by a production method described herein, the content of a composite(d) particle can be from 0.05 to 50 parts, preferably from 0.1 to 40 parts, further preferably from 0.1 to 30 parts based on 100 parts of this aqueous dispersion for CMP. When the content of the composite(d) particle is less than 0.05 parts, an aqueous dispersion having a sufficient polishing rate can not be obtained, which is undesirable. On the other hand, when this content is over 50 parts, flowability lowers, and a stable aqueous dispersion is not obtained easily.

This aqueous dispersion for CMP is particularly useful for polishing a working film of a semiconductor device and the like.

As a working film of a semiconductor device, there are listed a silicon oxide film, amorphous silicon film, polycrystalline silicon film, single crystalline silicon film, silicon nitride film, pure tungsten film, pure aluminum film, or pure copper film and the like, in addition, films made of an alloy of tungsten, aluminum, copper and the like with other metal provided on a semiconductor substrate in a production process of a semiconductor device such as VLSI and the like. Further, barrier metal layers made of an oxide, nitride and the like of a metal such as tantalum, titanium and the like can also be listed as a working film.

In this CMP, it is preferable that the hardness of a polymer particle constituting a composite(d) particle is appropriately selected depending on the hardness of a working film. For example, in the case of a working film made of copper, aluminum and the like which has lower hardness, it is preferable to use an aqueous dispersion for CMP containing a composite(d) particle produced by using a polymer particle having relatively lower hardness and an inorganic particle. On the other hand, in the case of a working film has higher hardness such as tungsten and the like, it is preferable to use an aqueous dispersion containing composite(d) particle produced by using a highly crosslinked polymer particle having relatively higher hardness and an inorganic particle.

Further, when a surface of polishing wafer is a metal in a working film of a semiconductor device, the polishing rate can be improved significantly by compounding an oxidizer in an aqueous dispersion. As this oxidizer, those which are admitted as appropriate by for example a Pourbaix diagram depending on the electrochemical natures of a processing surface and the like can be selected and used.

As the oxidizer, there are listed organic peroxides such as hydrogen peroxide, peracetic acid, perbenzoic acid, tert-butyl hydroperoxide and the like; permanganate compounds such as potassium permanganate and the like; bichromate compounds such as potassium bichromate and the like; halogenic acid compounds such as potassium iodate and the like; nitric acid compounds such as nitric acid and iron nitrate and the like; perhalogenic acid compounds such as perchloric acid and the like; transition metal salts such as potassium ferricyanide and the like; persulfates such as ammonium persulfate and the like; and other compounds. Among these oxidizers, hydrogen peroxide and organic peroxides which contain no metal element and of which decomposition product is harmless are particularly referable. By inclusion of these oxidizers, the polishing rate can be improved significantly.

The content of an oxidizer can be 15 parts or less, and preferably from 0.1 to 10 parts, more preferably from 0.1 to 8 parts, based on 100 parts of an aqueous dispersion for CMP. When this oxidizer is contained in an amount of 15 parts, the polishing rate can be sufficiently improved, and larger amount over 15 parts is not necessary.

Further, in this aqueous dispersion for CMP, various additives can be compounded, if necessary, in addition to the above-mentioned oxidizers. By this, the dispersing stability can be further improved, the polishing rate can be enhanced, and when surface of polishing wafer having two or more working films which have different hardness and the like, difference in polishing rate between working films can be controlled. Specifically, a more stable aqueous dispersion can be obtained by compounding an organic acid or inorganic acid. As the organic acid, formic acid, acetic acid, oxalic acid, malonic acid, succinic acid, tartaric acid, gluratic acid, adipic acid, fumaric acid, malic acid, maleic acid, lactic acid, benzoic acid and the like can be used. As the inorganic acid, nitric acid, sulfuric acid, phosphoric acid and the like can be used. As the acid for enhancing stability thereof, an organic acid is particularly preferable. These acids simultaneously have an action to raise the polishing rate.

Dispersibility and stability of an aqueous dispersion for CMP can also be improved by compounding these acids or hydroxides of alkali metals and ammonia and the like to control the pH. As the hydroxide of an alkali metal, sodium hydroxide, potassium hydroxide, rubidium hydroxide, cesium hydroxide and the like can be used. The polishing rate can also be raised by controlling the pH of an aqueous dispersion for CMP, and it is preferable to control the pH appropriately in a range wherein a composite(d) particle can exist stably, in view of the electrochemical natures of a surface of polishing wafer, dispersibility and stability of a polymer particle, and polishing rate.

Further, the polishing rate can also be raised by compounding a complexing agent. As this complexing agent, there can be used heterocyclic compounds such as 7-hydroxy-5-methyl-1,3,4-triazaindolidine, 3H-1,2,3-triazolo[4,5-b]pyridine-3-ol, 1H-tetrazole-1-acetic acid, 1-(2-dimethylaminoethyl)-5-mercaptotetrazole, bismuthiol, 4,5-dicyanoimidazole, adenine, 1-phenyl-5-mercapto-1H-tetrazole, 3-mercapto-1,2,4-triazole, 2-amino-4,5-dicyano-1H-imidazole, 4-amino-1,2,4-triazole, 5-amino-1H-tetrazole, 2-mercaptotriazoline, guanine, 1-phenyl-5-mercapto-1H-tetrazole, 4-amino-3-hydrazino-5-mercapto-1,2,4-triazole, 3-mercapto-4-methyl-4H-1,2,4-triazole, 1H-tetrazole, benzotriazoles such as 5-methyl-1H-benzotriazole and the like; tolyltriazole, thiourea, benzimidazole, benzofuroxane, 2,1,3-benzothiadiazole, 2-mercaptobenzothiazole, 2-mercaptobenzothiadiazole, 2-mercaptobenzooxazole, 2-aminobenzothiazole, 2-mercaptobenzothiazole, 2-amino-6-methylbenzothiazole, melamine, 3-amino-5,6-dimethyl-1,2,4-triazine, 2,4-diamino-6-diallylamino-1,3,5-triazine, benzoguanamine, thiocyanuric acid and the like. Further, salicylaldoxime, o-phenylenediamine, m-phenylenediamine, catechol, o-aminophenol and the like can also be used. The content of these complexing agents can be from 0.001 to 2 parts, and preferably from 0.01 to 1 part, particularly preferably from 0.02 to 0.5 parts, based on 100 parts of an aqueous dispersion for CMP.

Further, an aqueous dispersion for CMP can also contain a polyvalent metal ion which has an action to promote functions of an oxidizer and can further improve the polishing rate.

As this polyvalent metal ion, ions of metals such as aluminum, titanium, vanadium, chromium, manganese, iron, cobalt, nickel, copper, zinc, germanium, zirconium, molybdenum, tin, antimony, tantalum, tungsten, lead, cerium and the like are listed. These may be used alone or two or polyvalent metal ions may be present together.

The content of the polyvalent metal ion is from 3 to 3000 ppm, particularly from 10 to 2000 ppm based on an aqueous dispersion for CMP.

This polyvalent metal ion can be produced by adding a salt such as nitrate salts, sulfurate salt, acetate salt and the like or a complex containing a polyvalent metal element to an aqueous medium, or can also be produced by adding an oxide of a polyvalent metal element. Further, even a compound which a monovalent metal ion generates when added to an aqueous medium can be used providing this ion becomes a polyvalent metal ion by an oxidizer.

In this aqueous dispersion for CMP, a surfactant for uniformly dispersing a composite particle can also be compounded, in addition to a surfactant to be adsorbed on a polymer particle. However, it is preferable that this surfactant is used in small amounts from the standpoint of polishing properties. It is preferable that the content of the surfactant is 5 parts or less, particularly 3 parts or less, further 2 parts or less based on 100 prats of aqueous dispersion for CMP. The kind of the surfactant is not particularly restricted, and those generally used in preparation of an aqueous dispersion and the like can be used.

[Embodiments of the Invention]

The present invention will now be explained in greater detail by way of examples.

(1) Preparation of aqueous dispersion containing polymer particle

Synthesis Example 1 [Preparation of aqueous dispersion containing polymer particle (a)]

92 parts of styrene, 4 parts of methacrylic acid, 4 parts of hydroxyethyl acrylate, 0.1 part of ammonium laurylsulfate, 0.5 parts of ammonium persulfate and 400 parts of ion-exchanged water were charged into a 2-liter flask, the mixture was heated to 70° C. while stirring under a nitrogen gas atmosphere, and polymerized for 6 hours. By this, an aqueous dispersion containing a carboxy-modified polystyrene particle [polymer particle (a)] carrying a carboxyl group and a hydroxyl group and having an average particle size of 0.24 μm was obtained. The polymerization yield was 95%, and the distribution of a carboxyl group measured by a conductometric titration method revealed 40% in the particle, 50% on the surface of the particle, and 10% in an aqueous phase.

Synthesis Example 2 [Preparation of aqueous dispersion containing polymer particle (b)]

94.5 parts of methyl methacrylate, 4 parts of methacrylic acid, 1 part of divinylbenzene (purity: 55%), 0.5 parts of methacrylamide, 0.03 parts of ammonium laurylsulfate, 0.6 parts of ammonium persulfate and 400 parts of ion-exchanged water were charged into a 2-liter flask, the mixture was heated to 70° C. while stirring under a nitrogen gas atmosphere, and polymerized for 6 hours. By this, an aqueous dispersion containing a crosslinked polymethyl methacrylate-based particle [polymer particle (b)] carrying a carboxyl group and an amide group and having an average particle size of 0.17 μm was obtained. The polymerization yield was 95%, and the distribution of a carboxyl group measured by a conductometric titration method revealed 15% in the particle, 70% on the surface of the particle, and 15% in an aqueous phase.

Synthesis Example 3 [Preparation of aqueous dispersion containing polymer particle (c)]

90 parts of methyl methacrylate, 5 parts of methoxypolyethylene glycol methacrylate (manufactured by Shin Nakamura Kagaku Kogyo Co., Ltd., trade name: "NK Ester M-90G", #400), 5 parts of 4-vinylpyridine, 2 parts of an azo-type polymerization initiator (manufactured by Wako Pure Chemical Co., Ltd., trade name: "V50"), and 400 parts of ion-exchanged water were charged into a 2-liter flask, the mixture was heated to 70° C. while stirring under a nitrogen gas atmosphere, and polymerized for 6 hours. By this, an aqueous dispersion containing a polymethyl methacrylate-based particle [polymer particle (c)] carrying a functional group having a cation of an amino group and a polyethylene glycol chain and having an average particle size of 0.15 μm was obtained. The polymerization yield was 95%.

Synthesis Example 4 [Preparation of aqueous dispersion containing polymer particle (d)]

94 parts of methyl methacrylate, 1 part of methacrylic acid, 5 parts of hydroxymethyl methacrylate, 0.03 parts of ammonium laurylsulfate, 0.6 parts of ammonium persulfate and 400 parts of ion-exchanged water were charged into a 2-liter flask, the mixture was heated to 70° C. while stirring under a nitrogen gas atmosphere, and polymerized for 6 hours. By this, an aqueous dispersion containing a polymethyl methacrylate-based particle [polymer particle (d)] carrying a carboxyl group and a hydroxyl group and having an average particle size of 0.17 μm was obtained. The polymerization yield was 95%, and the distribution of a carboxyl group measured by a conductometric titration method revealed 15% in the particle, 70% on the surface of the particle, and 15% in an aqueous phase.

Figure 1:
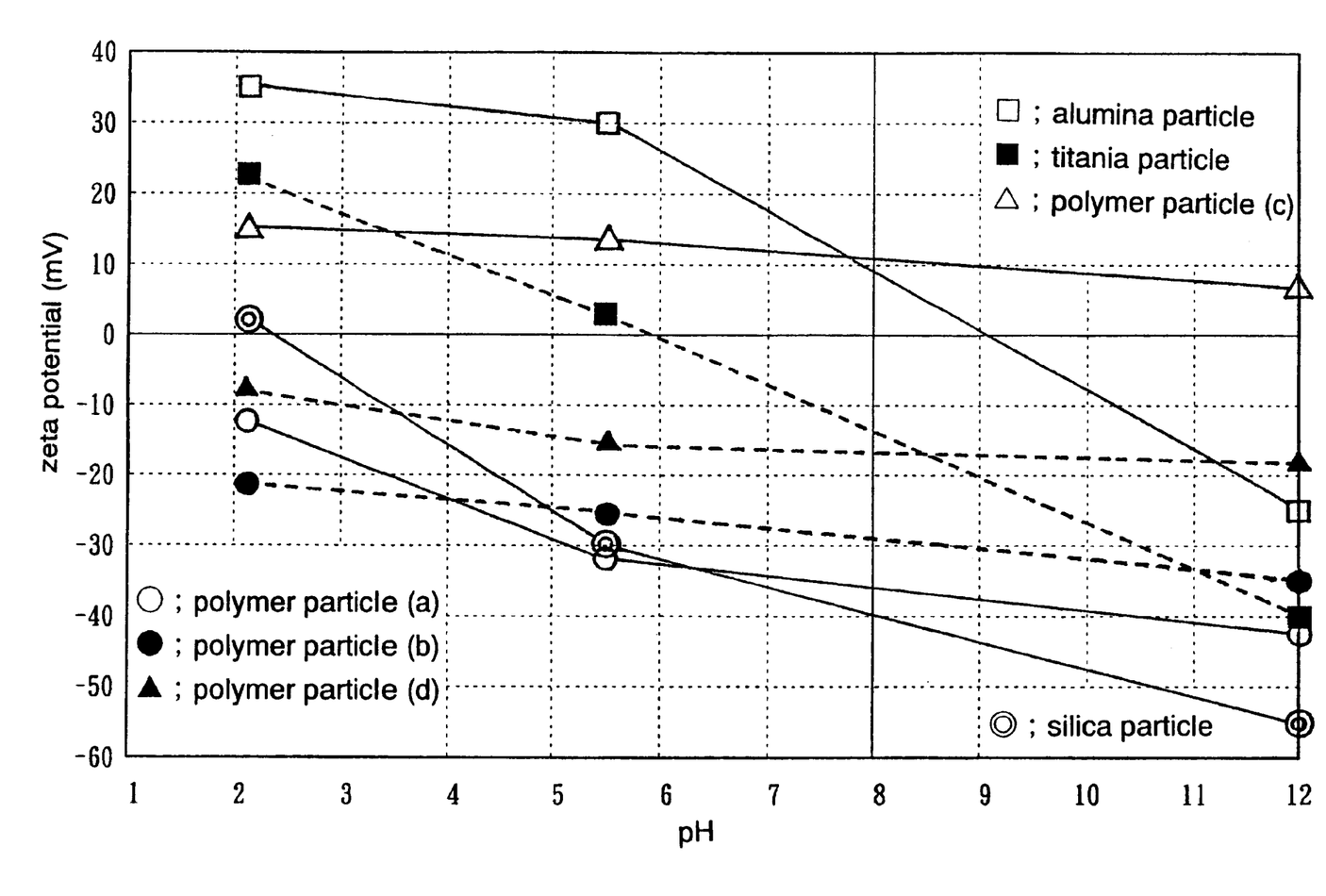
FIG. 1 is a graph showing a correlation between pH and zeta potential in an aqueous dispersion containing polymer particles or inorganic particles.

The thus obtained aqueous dispersions containing polymer particles (a) to (d) was dispersed in 100 parts of a 0.1 N potassium chloride aqueous solution so that the content of the polymer particle was 0.1 part, the pH of this aqueous dispersion was controlled by hydrochloric acid or potassium hydroxide to 2.1, 5.5 and 12, and zeta potential at each pH was measured by a laser Doppler electrophoresis light scattering mode zeta potential measuring apparatus (manufactured by COULTER Corp., type: "DELSA 440"). An inorganic particle used in the following examples was dispersed in an amount of 0.1 part in 100 parts by a 0.1 N potassium chloride aqueous solution, and each zeta potential was measured in the same manner. The results are described in Table 1, and simultaneously shown in FIG. 1.

TABLE 1

|  | | polymer particles | | | | inorganic particles | | |
|---|---|---|---|---|---|---|---|---|
|  | | (a) | (b) | (c) | (d) | alumina | titania | silica |
| pH | 2.1 | −12 | −20 | 16 | −8 | 36 | 22 | 2 |
|  | 5.5 | −30 | −25 | 12 | −15 | 30 | 3 | −30 |
|  | 12 | −40 | −34 | 8 | −18 | −25 | −40 | −55 |

(2) Preparation of aqueous dispersion containing composited particle

EXAMPLE 1

Preparation of Aqueous Dispersion Containing Composited Particle (A1)

pH of an aqueous dispersion containing 10 wt % of a polymer particle (a) was controlled with potassium hydroxide to 10, to obtain an aqueous dispersion (1). Further, the pH of an aqueous dispersion containing 10 wt % of colloidal alumina (manufactured by C I Kasei Co., Ltd., trade name: "NanoTek $Al_2O_3$") was controlled to 10 in the same manner, to obtain an aqueous dispersion (2). The zeta potential of the polymer particle (a) contained in the aqueous dispersion (1) was −38 mV, and the zeta potential of the alumina particle contained in the aqueous dispersion (2) was −8 mV.

Thereafter, 100 parts of the aqueous dispersion (1) and 100 parts of the aqueous dispersion (2) were mixed in a 2-liter flask, and the pH of the mixture was controlled with nitric acid to 7 and the mixture was stirred for 2 hours to obtain an aqueous dispersion containing a preliminary particle in which an alumina particle had adhered to the polymer particle (a). Then, 3 parts of tetraethoxysilane (TEOS) was added to this aqueous dispersion, the mixture was stirred for 1 hour at 25° C., then, heated to 40° C., further stirred for 3 hours, and cooled to obtain an aqueous dispersion containing a composited particle (A1). The average particle size of this composited particle (A1) was 280 nm, and about 85% of the whole composited particle (A1) was distributed in a range of 280 nm±50 nm. The zeta potential of the composited particle (A1) was +20 mV, and 95% of the surface area of the polymer particle (a) was coated with alumina particles.

EXAMPLE 2

Preparation of Aqueous Dispersion Containing Composited Particle (B1)

pH of an aqueous dispersion containing 10 wt % of a polymer particle (b) was controlled with potassium hydroxide to 8, to obtain an aqueous dispersion (3). 100 parts of the aqueous dispersion (3) was charged in a 2-liter flask, and heated to 60° C. while stirring. Then, 1 part of γ-glycidoxypropyltrimethoxysilane (GPTS) was continuously added over 2 hours, and reacted for 2 hours at 60° C. Then, 50 parts of an aqueous dispersion (4) containing 10 wt % of colloidal alumina (manufactured by C I Kasei Co., Ltd., trade name: "NanoTek $Al_2O_3$") was charged, and the mixture was stirred for 3 hours, to obtain an aqueous dispersion containing a preliminary particle in which an alumina particle had been bonded to the polymer particle (b) via GPTS.

Then, 2 parts of TEOS was added to this aqueous dispersion, the mixture was stirred for 1 hour at 25° C., then, heated to 60° C., further stirred for 2 hours, and cooled to obtain an aqueous dispersion containing a composited particle (B1). The average particle size of this composited particle (B1) was 230 nm, and about 80% of the whole composited particle (B1) was distributed in a range of 230 nm±50 nm. The zeta potential of the composited particle (B1) was +10 mV, and 58% of the surface area of the polymer particle (b) was coated with alumina particles.

EXAMPLE 3

Preparation of Aqueous Dispersion Containing Composited Particle (C1)

100 parts of an aqueous dispersion containing 10 wt % of a polymer particle (c) was charged in 2-liter flask, to this was added 1 part of methyltrimethylsilane was added, and the mixture was stirred at 40° C. for 2 hours. Then, the pH was controlled to 2 with nitric acid, to obtain an aqueous dispersion (5). Further, the pH of an aqueous dispersion containing 10 wt % of colloidal silica (manufactured by Nissan Chemical Industries Co., Ltd., trade name: "Snowtex O") was controlled to 8 with potassium hydroxide, to obtain an aqueous dispersion (6). The zeta potential of the polymer particle (c) contained in the aqueous dispersion (5) was +17 mV, and the zeta potential of the silica particle contained in the aqueous dispersion (6) was −40 mV.

Thereafter, 50 parts of the aqueous dispersion (6) was gradually added to 100 parts of the aqueous dispersion (5) over 2 hours, they were mixed and stirred for 2 hours, to obtain an aqueous dispersion containing a preliminary particle in which a silica particle had adhered to the polymer particle (c). Then, 2 parts of vinyltriethoxysilane was added to this aqueous dispersion, the mixture was stirred for 1 hour, then, 1 part of TEOS was added, heated to 60° C., stirred for 3 hours, and then cooled to obtain an aqueous dispersion containing a composited particle (C1). The average particle size of this composited particle (C1) was 180 nm, and about 85% of the whole composited particle (C1) was distributed in a range of 180 nm±30 nm. The zeta potential of the composited particle (C1) was −30 mV, and 100% of the surface area of the polymer particle (c) was coated with silica particles.

EXAMPLE 4

Preparation of Aqueous Dispersion Containing Composited Particle (D1)

1 wt % of ammonium polycarboxylate (average molecular weight: about 2000) was added to the polymer particle (d), and the mixture was stirred for 30 minutes for adsorption. Then, the pH of an aqueous dispersion containing 10 wt % of a polymer particle (d) was controlled with potassium hydroxide to 8, to obtain an aqueous dispersion (7). Further, the pH of an aqueous dispersion containing 10 wt % of colloidal titania (manufactured by CI Kasei Co., Ltd., trade name: "NanoTek $TiO_2$") was also controlled to 8 in a like manner, to obtain an aqueous dispersion (8). The zeta potential of the polymer particle (d) contained in the aqueous dispersion (7) was −25 mV, and the zeta potential of the titania particle contained in the aqueous dispersion (8) was −12 mV.

Thereafter, 100 parts of the aqueous dispersion (7) and 80 parts of the aqueous dispersion (8) were charged in a 2-liter flask, and the pH of the mixture was controlled with nitric acid to 4 and the mixture was stirred for 2 hours to obtain an aqueous dispersion containing a preliminary particle in which a titania particle had adhered to the polymer particle (d). Then, 4 parts of dimethyldiethoxysilane was added to this aqueous dispersion, the mixture was stirred for 2.5 hours, then, heated to 50° C., further stirred for 4 hours, and cooled to obtain an aqueous dispersion containing a composited particle (D1). The average particle size of this composited particle (D1) was 215 nm, and about 80% of the whole composited particle (D1) was distributed in a range of 215 nm±50 nm. The zeta potential of the composited particle (D1) was +15 mV, and 85% of the surface area of the polymer particle (d) was coated with titania particles.
(3) Preparation of an aqueous dispersion containing composite particle
Synthesis Example 5 [Preparation of aqueous dispersion containing composite particle (A2)]

100 parts of aqueous dispersion (1) and 100 parts of aqueous dispersion (2) prepared in Example 1 were mixed, and the pH of the mixture was controlled with nitric acid to 7 and the mixture was stirred for 2 hours to obtain an aqueous dispersion containing a composite particle (A2) in which an alumina particle had adhered to the polymer particle (a). The average particle size of this composite particle (A2) was 280 nm, and about 85% of the whole composite particle (A2) was distributed in a range of 280 nm±50 nm. The zeta potential of the composite particle (A2) was +20 mV, and 95% of the surface area of the polymer particle (a) was coated with alumina particles.
Synthesis Example 6 [Preparation of aqueous dispersion containing composite particle (B2)]

The pH of an aqueous dispersion containing 10 wt % of a polymer particle (b) was controlled with potassium hydroxide to 11, to obtain an aqueous dispersion (9). Further, the pH of an aqueous dispersion containing 10 wt % of colloidal alumina (manufactured by C I Kasei Co., Ltd., trade name: "NanoTek $Al_2O_3$") was controlled to 11 in the same manner, to obtain an aqueous dispersion (10). The zeta potential of the polymer particle (b) contained in the aqueous dispersion (9) was −34 mV, and the zeta potential of the alumina particle contained in the aqueous dispersion (10) was −17 mV.

Thereafter, 100 parts of aqueous dispersion (9) and 50 parts of aqueous dispersion (10) were mixed, and the pH of the mixture was controlled with nitric acid to 8 and the mixture was stirred for 3 hours to obtain an aqueous dispersion containing a composite particle (B2) in which an alumina particle had adhered to the polymer particle (b). The average particle size of this composite particle (B2) was 230 nm, and about 80% of the whole composite particle (B2) was distributed in a range of 230 nm±50 nm. The zeta potential of the composite particle (B2) was +10 mV, and 58% of the surface area of the polymer particle (b) was coated with alumina particles.

Synthesis Example 7 [Preparation of aqueous dispersion containing composite particle (C2)]

The pH of an aqueous dispersion containing 10 wt % of a polymer particle (c) was controlled to 2 with nitric acid, to obtain an aqueous dispersion (11). Further, the pH of an aqueous dispersion containing 10 wt % of colloidal silica (manufactured by Nissan Chemical Industries Co., Ltd., trade name: "Snowtex O") was controlled to 2 in a like manner, to obtain an aqueous dispersion (12). The zeta potential of the polymer particle (c) contained in the aqueous dispersion (11) was +17 mV, and the zeta potential of the silica particle contained in the aqueous dispersion (12) was +2 mV.

Thereafter, 100 parts of aqueous dispersion (11) and 50 parts of aqueous dispersion (12) were mixed, and the pH of the mixture was controlled with potassium hydroxide to 5 and the mixture was stirred for 2 hours to obtain an aqueous dispersion containing a composite particle (C2) in which a silica particle had adhered to the polymer particle (c). The average particle size of this composite particle (C2) was 180 nm, and about 85% of the whole composite particle (C2) was distributed in a range of 180 nm±30 nm. The zeta potential of the composite particle (C2) was −30 mV, and 100% of the surface area of the polymer particle (c) was coated with silica particles.

Synthesis Example 8 [Preparation of aqueous dispersion containing composite particle (D2)]

100 parts of the aqueous dispersion (7) and 80 parts of the aqueous dispersion (8) prepared in Example 4 were mixed, and the pH of the mixture was controlled with nitric acid to 4 and the mixture was stirred for 2 hours to obtain an aqueous dispersion containing a composite particle (D2) in which a titania particle had adhered to the polymer particle (d). The average particle size of this composite particle (D2) was 215 nm, and about 80% of the whole composite particle (D2) was distributed in a range of 215 nm±50 nm. The zeta potential of the composite particle (D2) was +15 mV, and 85% of the surface area of the polymer particle (d) was coated with titania particles.

In Examples 1 to 4 and Synthesis Examples 5 to 8, the average particle size, particle size distribution and proportion of coated area were measured as follows.

Average particle size and particle size distribution: Particle size was measured for 50 particles by a transmission electron microscope, and calculations were conducted based on the measured values.

Proportion of coated area: A composite(d) particle was observed by a scanning electron microscope, photographed, and the coated area with inorganic particles per one composite(d) particle was measured on a photograph having a magnification of 100000, and calculation was conducted by the formula: [coated area/(coated area+non-coated area)]×100 based on the measured value.

(4) Preparation of aqueous dispersion for CMP and CMP test using the same

EXAMPLE 5

Preparation of Aqueous Dispersion for CMP Containing Composited Particle (A1) and CMP Test of Copper Film An aqueous dispersion containing a composited particle (A1), hydrogen peroxide, salicylaldoxime and ammonium lactate were compounded into ion-exchanged water so that the concentrations of the composited particle (A1), hydrogen peroxide, salicylaldoxime and ammonium lactate were 3 wt %, 1 wt %, 0.3 wt % and 1 wt %, respectively, then, the pH of the mixture was controlled to 6 with potassium hydroxide to obtain an aqueous dispersion for CMP.

A copper film (film thickness; 15000 Å) on a silicon wafer equipped with a 8 inch heat oxidized film was set on a CMP apparatus (manufactured by Lap Master SFT, type: "LPG510"), and polished for 1 minute by a polishing pad made of porous polyurethane (manufactured by Rodel Nitta, product no: "IC1000") so that the load was 300 g/cm$^2$ using the above-mentioned aqueous dispersion for CMP. The thickness of the copper film after polishing was measured by an electric conductive type film thickness measuring apparatus, and the polishing rate was calculated to find that it was 5500 Å/min. Further, a silica film formed on a silicon substrate was polished under the same conditions, washed, and dried, then, observed by KLA (manufactured by KLA Tencol Corp., type: "Surf Scan SP-1") to find that the number of scratch on a surface to be polished was 30 or less.

EXAMPLE 6

Preparation of Aqueous Dispersion for CMP Containing Composited Particle (B1) and CMP Test of Aluminum Film An aqueous dispersion containing a composited particle (B1), and ammonium persulfate were compounded into ion-exchanged water so that the concentrations of the composited particle (B1) and ammonium persulfate were 5 wt % and 1 wt % respectively, then, the pH of the mixture was controlled to 4 with nitric acid to obtain an aqueous dispersion for CMP.

An aluminum film (film thickness; 5000 Å, containing 1% of copper) on a silicon wafer equipped with a 8 inch heat oxidized film was polished in the same manner as in Example 5 using this aqueous dispersion for CMP. Subsequently, the polishing rate was calculated, and the presence or absence of scratch was confirmed in the same manner as in Example 5. As a result, the polishing rate was 4300 Å/min., and the number of scratches on a surface to be polished was 30 or less.

EXAMPLE 7

Preparation of Aqueous Dispersion for CMP Containing Composited Particle (C1) and CMP Test of Copper Film An aqueous dispersion containing a composited particle (C1), hydrogen peroxide, 7-hydroxy-5-methyl-1,3,4-triazaindolidine and ammonium lactate were compounded into ion-exchanged water so that the concentrations of the composited particle (C1), hydrogen peroxide, 7-hydroxy-5-methyl-1,3,4-triazaindolidine and ammonium lactate were 3.5 wt %, 1 wt %, 0.3 wt % and 0.5 wt % respectively, then, the pH of the mixture was controlled to 7.2 with ammonia to obtain an aqueous dispersion for CMP.

A copper film was polished in the same manner as in Example 5 using this aqueous dispersion for CMP. Subsequently, the polishing rate was calculated, and the presence or absence of scratch was confirmed in the same manner as in Example 5. As a result, the polishing rate was 5700 Å/min., and the number of scratches on a surface to be polished was 30 or less.

EXAMPLE 8

Preparation of Aqueous Dispersion for CMP Containing Composited Particle (D1) and CMP Test of Tungsten Film An aqueous dispersion containing a composited particle (D1), iron nitrate and malonic acid were compounded into ion-exchanged water so that the concentrations of the composited particle (D1), iron nitrate and malonic acid were 3 wt %, 0.1 wt % and 1 wt %, respectively, then, the pH of the mixture was controlled to 2 with nitric acid to obtain an aqueous dispersion for CMP.

A tungsten film (film thickness: 5000 Å) on a silicon wafer equipped with a 8 inch heat oxidized film was polished in the same manner as in Example 5 using this aqueous dispersion for CMP. Subsequently, the polishing rate was calculated, and the presence or absence of scratch was confirmed in the same manner as in Example 5. As a result, the polishing rate was 3500 Å/min., and the number of scratches on a surface to be polished was 30 or less.

COMPARATIVE EXAMPLE 1

Preparation of Aqueous Dispersion Containing No Composited Particle and Polishing Test of Copper Film An aqueous dispersion was prepared in the same manner as in Example 5 except that a polymer particle (a) was used instead of a composited particle (A1). A copper film was polished by the same apparatus and in the same manner as in example 5 using this aqueous dispersion, and the polishing rate was calculated and the presence or absence of scratch was confirmed in the same manner as in Example 5, as a result, the polishing rate was as low as 1500 Å/min., while the number of scratches on a surface to be polished was 30 or less.

COMPARATIVE EXAMPLE 2

Preparation of Aqueous Dispersion Containing No Composited Particle and Polishing Test of Copper Film An aqueous dispersion was prepared in the same manner as in Example 7 except that an aqueous dispersion having a concentration of 10 wt % which had been prepared by dispersing a fumed method alumina particle (manufactured by Degussa, trade name: "Alminium Oxide C") instead of a composited particle (C1) in ion-exchanged water, and subjected to ultrasonic treatment was compounded.

A copper film was polished by the same apparatus and in the same manner as in Example 5 using this aqueous dispersion, and the polishing rate was calculated and the presence or absence of scratch was confirmed in the same manner as in Example 5, as a result, the polishing rate was as sufficient as 6000 Å/min., while a lot of scratches were observed.

EXAMPLE 9

Preparation of Aqueous Dispersion for CMP Containing Composite Particle (A2) and CMP Test of Copper Film An aqueous dispersion containing a composite particle (A2), hydrogen peroxide, salicylaldoxime and ammonium lactate were compounded into ion-exchanged water so that the concentrations of the composite particle (A2), hydrogen peroxide, salicylaldoxime and ammonium lactate were 3 wt %, 1 wt %, 0.3 wt % and 1 wt %, respectively, then, the pH of the mixture was controlled to 6 with potassium hydroxide to obtain an aqueous dispersion for CMP.

A copper film was polished by the same apparatus and in the same manner as in example 5 using this aqueous dispersion for CMP, and the polishing rate was calculated and the presence or absence of scratch was confirmed in the same manner as in Example 5, as a result, the polishing rate was 5500 Å/min., and the number of scratches on a surface to be polished was 30 or less.

EXAMPLE 10

Preparation of Aqueous Dispersion for CMP Containing Composite Particle (B2) and CMP Test of Aluminum Film An aqueous dispersion containing a composite particle (B2), and ammonium persulfate were compounded into ion-exchanged water so that the concentrations of the composite particle (B2) and ammonium persulfate were 5 wt % and 1 wt %, respectively, then, the pH of the mixture was controlled to 4 with nitric acid to obtain an aqueous dispersion for CMP.

An aluminum film (film thickness; 5000 Å, containing 1 wt % of copper) on a silicon wafer equipped with a 8 inch heat oxidized film was polished in the same manner as in Example 5 using this aqueous dispersion for CMP. Subsequently, the polishing rate was calculated, and the presence or absence of scratch was confirmed in the same manner as in Example 5. As a result, the polishing rate was 4300 Å/min., and the number of scratches on a surface to be polished was 30 or less.

EXAMPLE 11

Preparation of Aqueous Dispersion for CMP Containing Composite Particle (C2) and CMP Test of Copper Film An aqueous dispersion containing a composite particle (C2), hydrogen peroxide, 7-hydroxy-5-methyl-1,3,4-triazaindolidine and malonic acid were compounded into ion-exchanged water so that the concentrations of the composite particle (C2), hydrogen peroxide, 7-hydroxy-5-methyl-1,3,4-triazaindolidine and malonic acid were 3.5 wt %, 1 wt %, 0.3 wt % and 0.5 wt %, respectively, then, the pH of the mixture was controlled to 7.2 with ammonia to obtain an aqueous dispersion for CMP.

A copper film was polished in the same manner as in Example 5 using this aqueous dispersion for CMP. Subsequently, the polishing rate was calculated, and the presence or absence of scratch was confirmed in the same manner as in Example 5. As a result, the polishing rate was 5700 Å/min., and the number of scratches on a surface to be polished was 30 or less.

EXAMPLE 12

Preparation of Aqueous Dispersion for CMP Containing Composite Particle (D2) and CMP Test of Tungsten Film An aqueous dispersion containing a composite particle (D2), iron nitrate and malonic acid were compounded into ion-exchanged water so that the concentrations of the composite particle (D2), iron nitrate and malonic acid were 3 wt %, 0.1 wt % and 1 wt %, respectively, then, the pH of the mixture was controlled to 2 with nitric acid to obtain an aqueous dispersion for CMP.

A tungsten film (film thickness: 5000 Å) on a silicon wafer equipped with a 8 inch heat oxidized film was polished in the same manner as in Example 5 using this aqueous dispersion for CMP. Subsequently, the polishing rate was calculated, and the presence or absence of scratch was confirmed in the same manner as in Example 5. As a result, the polishing rate was 3500 Å/min., and the number of scratches on a surface to be polished was 30 or less.

COMPARATIVE EXAMPLE 3

Preparation of Aqueous Dispersion Containing No Composite Particle and Polishing Test of Copper Film An aqueous dispersion was prepared in the same manner as in Example 9 except that a polymer particle (a) was used instead of a composite particle (A2). A copper film was polished by the same apparatus and in the same manner as in example 5 using this aqueous dispersion, and the polishing rate was calculated and the presence or absence of scratch was confirmed in the same manner as in Example 5, as a result, the polishing rate was as low as 1500 Å/min., while the number of scratches on a surface to be polished was 30 or less.

COMPARATIVE EXAMPLE 4

Preparation of Aqueous Dispersion Containing No Composite Particle and Polishing Test of Copper Film An aqueous dispersion was prepared in the same manner as in Example 11 except that an aqueous dispersion comprising a fumed method alumina particle in Comparative Example 2 instead of a composite particle (C2) was compounded.

A copper film was polished by the same apparatus and in the same manner as in Example 5 using this aqueous dispersion, and the polishing rate was calculated and the presence or absence of scratch was confirmed in the same manner as in Example 5, as a result, the polishing rate was as sufficient as 6000 Å/min., while a lot of scratches were observed.

(5) CMP test of low dielectric insulation film
(5-1) Synthesis of low dielectric insulation material 170.7 g of methyltrimethoxysilane, 42.7 g of tetramethoxysilane, 1.0 g of diisopropoxytitaniumbisethyl acetylacetate and 417 g of propylene glycol monopropyl ether were charged into a separable flask and the mixture was stirred, then, heated to 60° C. Then, a mixture of 176 g of ion-exchanged water and 206 g of propylene glycol monopropyl ether was added to this over 2 hours while keeping the temperature at 60° C., then, they were reacted at 60° C. for a further 8 hours. Then, 51 g of acetylacetone was added, and 500 g of a solvent containing methanol was removed at 40° C. under reduced pressure, to obtain an aqueous solution containing a lower dielectric insulation material.

(5-2) Coated film composed of lower dielectric insulation material and manufacture of film containing lower dielectric insulation material On the surface of a 8 inch silicon wafer, an aqueous solution obtained in (5-1) was coated by a spin coated. The rotation rate was 2500 rpm, and coating was conducted in 31 seconds. Then, this wafer coated with the aqueous solution was heated for 5 minutes on a hot plate controlled at 80° C., to remove an organic solvent. Then, this wafer was heated for 5 minutes on a hot plate controlled at 200° C., then, further heated for 60 minutes in an oven having a nitrogen atmosphere controlled at 450° C., to harden a coated film on the surface of the wafer, forming a film.

(5-3) Evaluation of dielectric constant of film

Aluminum was vapor-deposited on a film obtained in (5-2), and dielectric constant was measured at a frequency of 1 MHz to find it was as low as 2.65. This dielectric constant was measured by using HP16451B electrodes and HP4284A Precision LCR manufactured by Yokogawa Hewlett-Packard Corp.

EXAMPLE 13

Preparation of Aqueous Dispersion for CMP Containing Composited Particle (C1) and CMP Test of Lower Dielectric Insulation Film An aqueous dispersion containing a composited particle (C1), and benzotriazole were compounded into ion-exchanged water so that the concentrations of the composited particle (C1) and benzotriazole were 3 wt % and 0.05 wt %, respectively, then, the pH of the mixture was controlled to 7.5 with potassium hydroxide to obtain an aqueous dispersion for CMP.

A film composed of a lower dielectric insulation material formed in the same manner as in (5-2) was polished in the same manner as in Example 5 using this aqueous dispersion for CMP. Further, the polishing rate was calculated by a light interference type film thickness measuring apparatus, and the presence or absence of scratch was confirmed. As a result, the polishing rate was 50 Å/min., and the number of scratches on a surface to be polished was 30 or less.

EXAMPLE 14

Production of Aqueous Dispersion for CMP Containing Composited Particle (C1) and CMP Test of Lower Dielectric Insulation Film An aqueous dispersion for CMP was produced in the same manner as in Example 13. Polishing was conducted in the same manner as in Example 13 except that trade name "FLARE" (dielectric constant: about 2.7) manufactured by Allied Signal Corp. was used instead of a film formed in the same manner as in (5-2) as a lower dielectric insulation film. The polishing rate was calculated and the presence or absence of scratch was confirmed in the same manner as in Example 13. As a result, the polishing rate was 55 Å/min., and the number of scratches on a surface to be polished was 30 or less.

EXAMPLE 15

Production of Aqueous Dispersion for CMP Containing Composited Particle (C1) and CMP Test of Lower Dielectric Insulation Film Polishing was conducted in the same manner as in Example 14 except that trade name "BCB" (dielectric constant: about 2.7) manufactured by Dow Chemical Corp. was used instead of trade name "FLARE" manufactured by Allied Signal Corp. The polishing rate was calculated and the presence or absence of scratch was confirmed in the same manner as in Example 13. As a result, the polishing rate was 65 Å/min., and the number of scratches on a surface to be polished was 30 or less.

COMPARATIVE EXAMPLE 5

Preparation of Aqueous Dispersion for CMP Containing No Composited Particle and CMP Test of Lower Dielectric Insulation Film An aqueous dispersion for CMP was obtained in the same manner as in Example 13 except that an aqueous dispersion comprising a fumed method alumina particle in Comparative Example 2 instead of an aqueous dispersion containing a composited particle (C1) was compounded.

A film composed of a lower dielectric insulation material formed in the same manner as in (5-2) was polished in the same manner as in example 5 using this aqueous dispersion for CMP. The polishing rate was calculated and the presence or absence of scratch was confirmed in the same manner as in Example 5, as a result, the polishing rate was as sufficient as 70 Å/min., while a lot of scratches were observed on a surface to be polished.

EXAMPLE 16

Production of Aqueous Dispersion for CMP Containing Composite Particle (C2) and CMP Test of Lower Dielectric Insulation Film An aqueous dispersion containing a composite particle (C2), and benzotriazole were compounded into ion-exchanged water so that the concentrations of the composite particle (C2) and benzotriazole were 3 wt % and 0.05 wt %, respectively, then, the pH of the mixture was controlled to 7.5 with potassium hydroxide to obtain an aqueous dispersion for CMP.

A film composed of a lower dielectric insulation material formed in the same manner as in (5-2) was polished in the same manner as in Example 5 using this aqueous dispersion for CMP. Further, the polishing rate was calculated and the presence or absence of scratch was confirmed in the same manner as in Example 13. As a result, the polishing rate was 50 Å/min., and the number of scratches on a surface to be polished was 30 or less.

EXAMPLE 17

Production of Aqueous Dispersion for CMP Containing Composite Particle (C2) and CMP Test of Lower Dielectric Insulation Film An aqueous dispersion for CMP was produced in the same manner as in Example 16. Polishing was conducted in the same manner as in Example 5 except that "FLARE" (trade name) (dielectric constant: about 2.7) manufactured by Allied Signal was used instead of a film formed in the same manner as in (5-2) as a lower dielectric insulation film. The polishing rate was calculated and the presence or absence of scratch was confirmed in the same manner as in Example 13. As a result, the polishing rate was 55 Å/min., and the number of scratches on a surface to be polished was 30 or less.

EXAMPLE 18

Production of Aqueous Dispersion for CMP Containing Composite Particle (C2) and CMP Test of Lower Dielectric Insulation Film Polishing was conducted in the same manner as in Example 5 except that trade name "BCB" (dielectric constant: about 2.7) manufactured by Dow Chemical Corp. was used instead of trade name "FLARE" manufactured by Allied Signal Corp. The polishing rate was calculated and the presence or absence of scratch was confirmed in the same manner as in Example 13. As a result, the polishing rate was 65 Å/min., and the number of scratches on a surface to be polished was 30 or less.

COMPARATIVE EXAMPLE 6

Preparation of Aqueous Dispersion for CMP Containing No Composite Particle and CMP Test of Lower Dielectric Insulation Film An aqueous dispersion for CMP was obtained in the same manner as in Example 16 except that an aqueous dispersion comprising a fumed method alumina particle in Comparative Example 2 instead of an aqueous dispersion containing a composite particle (C2) was compounded.

A film composed of a lower dielectric insulation material formed in the same manner as in (5-2) was polished in the same manner as in Example 5 using this aqueous dispersion for CMP. The polishing rate was calculated and the presence or absence of scratch was confirmed in the same manner as in Example 13, as a result, the polishing rate was as sufficient as 70 Å/min., while a lot of scratches were observed on a surface to be polished.

What is claimed is:

1. A method for producing a composited particle comprising forming a preliminary particle by adhering one or more types of inorganic particles on at least a part of the outside surface area of a polymer particle, then, polycondensing at least one selected from among organosilicon compounds and organometal compounds in the presence of said preliminary particle.

2. The method for producing a composited particle according to claim 1, wherein said inorganic particle is adhered to said polymer particle via a connecting compound.

3. The method for producing a composited particle according to claim 2, wherein said connecting compound is a silane coupling agent.

4. The method for producing a composited particle according to claim 1, wherein said inorganic particle is of at least one selected from among alumina, titania and ceria.

5. The method for producing a composited particle according to claim 4, wherein said polymer particle has at least one selected from among carboxyl groups, anions thereof, sulfonate groups and anions thereof.

6. The method for producing a composited particle according to claim 4, wherein at least one selected from among negative surfactants and negative water-soluble polymers is adsorbed or chemically-bonded to said polymer particle.

7. The method for producing a composited particle according to claim 1, wherein said inorganic particle is of at least one selected from among silica and zirconia.

8. The method for producing a composited particle according to claim 7, wherein said polymer particle has at least one selected from among amino groups and cations thereof.

9. The method for producing a composited particle according to claim 7, wherein at least one selected from among positive surfactants and positive water-soluble polymers is adsorbed or chemically-bonded to said polymer particle.

10. The method for producing a composited particle according to claim 1, wherein said inorganic particle is adhered to said polymer particle by an electrostatic force.

11. The method for producing a composited particle according to claim 10, wherein said inorganic particle is of at least one selected from among alumina, titania and ceria.

12. The method for producing a composited particle according to claim 11, wherein said polymer particle has at least one selected from among carboxyl groups, anions thereof, sulfonate groups and anions thereof.

13. The method for producing a composited particle according to claim 11, wherein at least one selected from among negative surfactants and negative water-soluble polymers is adsorbed or chemically-bonded to said polymer particle.

14. The method for producing a composited particle according to claim 10, wherein said inorganic particle is of at least one selected from among silica and zirconia.

15. The method for producing a composited particle according to claim 14, wherein said polymer particle has at least one selected from among amino groups and cations thereof.

16. The method for producing a composited particle according to claim 8, wherein at least one selected from among positive surfactants and positive water-soluble polymers is adsorbed or chemically-bonded to said polymer particle.

17. The method for producing a composited particle according to claim 1, wherein said composited particle is formed by adhering a plurality of said inorganic particles on the surface area of said polymer particle.

18. The method for producing a composited particle according to claim 1, wherein said composited particle is formed by coating at least 5% of surface area of said polymer particle by said inorganic particle.

19. The method for producing a composited particle according to claim 1, wherein the average particle size of said composited particle is from 0.05 to 0.5 $\mu$m, and at least 80% of said composited particle has particle sizes within a range of said average particle size±30%.

20. A composited particle produced by a method according to any one of claims 1 to 19.

21. An aqueous dispersion for chemical mechanical polishing, comprising composited particles produced by a method according to any one of claims 1 to 19.

* * * * *